(12) United States Patent
Mizuno et al.

(10) Patent No.: US 7,181,833 B2
(45) Date of Patent: Feb. 27, 2007

(54) METHOD OF MOUNTING AN ELECTRONIC PART

(75) Inventors: Toru Mizuno, Tokyo (JP); Tomomi Asakura, Tokyo (JP); Masatoshi Ito, Tokyo (JP); Masaaki Kaneko, Tokyo (JP); Toshinobu Miyagoshi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/978,365

(22) Filed: Nov. 2, 2004

(65) Prior Publication Data

US 2005/0076498 A1 Apr. 14, 2005

Related U.S. Application Data

(62) Division of application No. 10/682,731, filed on Oct. 10, 2003, now Pat. No. 6,931,717.

(51) Int. Cl.
*B23P 19/00* (2006.01)

(52) U.S. Cl. .................. 29/740; 29/741; 29/743; 29/759; 29/836

(58) Field of Classification Search .......... 29/740, 29/741, 743, 759, 714, 836
See application file for complete search history.

(56) References Cited

U.S. PATENT DOCUMENTS

| 5,033,783 | A | * | 7/1991 | Izumi et al. .............. 294/64.1 |
| 5,086,556 | A | * | 2/1992 | Toi .............................. 29/740 |
| 5,088,187 | A | * | 2/1992 | Takata et al. ................ 29/705 |
| 5,208,975 | A | * | 5/1993 | Hidese ......................... 29/832 |
| 5,384,956 | A | | 1/1995 | Sakurai et al. |
| 5,588,195 | A | * | 12/1996 | Asai et al. ................. 29/33 M |
| 5,745,241 | A | * | 4/1998 | Hashimoto ................. 356/635 |
| 5,894,657 | A | * | 4/1999 | Kanayama et al. ........... 29/740 |
| 6,337,489 | B1 | | 1/2002 | Matsumoto et al. |
| 6,389,688 | B1 | | 5/2002 | Srivastava et al. |
| 6,519,838 | B1 | | 2/2003 | Okuda et al. |
| 6,519,840 | B1 | | 2/2003 | Stalder |
| 6,530,146 | B2 | | 3/2003 | Link |

FOREIGN PATENT DOCUMENTS

| JP | 11-274240 | 10/1999 |
| JP | 2001-35864 | 2/2001 |
| JP | 2001-60795 | 3/2001 |
| JP | 2001-267798 | 9/2001 |
| JP | 2002-118153 | 4/2002 |
| KR | 2001-0090483 | 10/2001 |

* cited by examiner

*Primary Examiner*—A. Dexter Tugbang
*Assistant Examiner*—Tai Van Nguyen
(74) *Attorney, Agent, or Firm*—Oblon, Spivak, McClelland, Maier & Neustadt, P.C.

(57) ABSTRACT

The invention provides a mounting method capable of coping with high density mounting, narrower pitch mounting, cavity mounting and the like. In this method, displacement amounts of a chip that is picked up from a wafer by a pick-up nozzle to be held by the pick-up nozzle, with respect to a reference attitude, are obtained, and when the chip is delivered to a mounting nozzle for actually mounting the chip onto a substrate, the displacement amounts are corrected while taking the displacement amounts into consideration, so that the mounting nozzle always holds the chip in a fixed attitude.

2 Claims, 5 Drawing Sheets

METHOD OF MOUNTING AN ELECTRONIC PART

CROSS-REFERENCE TO RELATED APPLICATIONS

The present application is a divisional of U.S. application Ser. No. 10/682,731 filed Oct. 10, 2003 now U.S. Pat. No. 6,931,717, the entire contents of which are hereby incorporated herein by reference.

BACKGROUND OF THE INVENTION

1. Field of the Invention

The present invention relates to an apparatus and a method for mounting an electronic part onto a circuit substrate. More particularly, the invention relates to a mounting apparatus and a mounting method which are suitably used when IC chips called flip chips each including bumps (projection type electrodes) are mounted onto a circuit substrate.

2. Related Background Art

In recent years, as electronic apparatuses have been miniaturized, it has been required to mount electronic parts onto a circuit substrate more densely. For the purpose of meeting such a requirement, there has been advanced promotion of the decreasing of pitches of parts as well as promotion of the increasing of positional accuracy during the mounting. In addition, as a new form, a technique in which an electronic part is mounted in a cavity defined within a multi-layered substrate has been frequently adopted.

In such a process for mounting an electronic part, conventionally, an image processing technique has been used as a method of enhancing the positional accuracy when an electronic part is mounted onto a circuit substrate. More specifically, a picture which is obtained by capturing an image of a circuit substrate with a camera or the like in advance is image-processed to thereby determine a position where an electronic part is intended to be mounted. At the same time, a position where an electronic part arranged in a loading position is to be arranged is also determined through the similar processing. Then, these positions are compared with each other to obtain relative positional displacements. The electronic parts arranged in the loading position are individually picked up with a pick-up nozzle to be temporarily placed on an intermediate stage. Then, the electronic parts are individually held by a mounting nozzle. Then, the processing for mounting the electronic parts are executed using the mounting nozzle after taking the positional displacements into consideration.

In a case where a chip such as an IC is mounted onto a circuit substrate, a mounting head holding a chip makes the chip come into contact with a predetermined position on the circuit substrate. Then, ultrasonic vibrations are applied to the chip concerned through the mounting head to connect (join) the chip to the circuit substrate. As the promotion of narrow pitches has been advanced as described above, it is required for the mounting nozzle as well not to interfere with a space in the periphery of the positions where the chips are to be mounted. Consequently, it is preferable that the shape of a chip holding portion in the mounting nozzle is fitted for the shape of a chip, and the size of the chip holding portion is smaller than that of the chip.

Figure 4A:
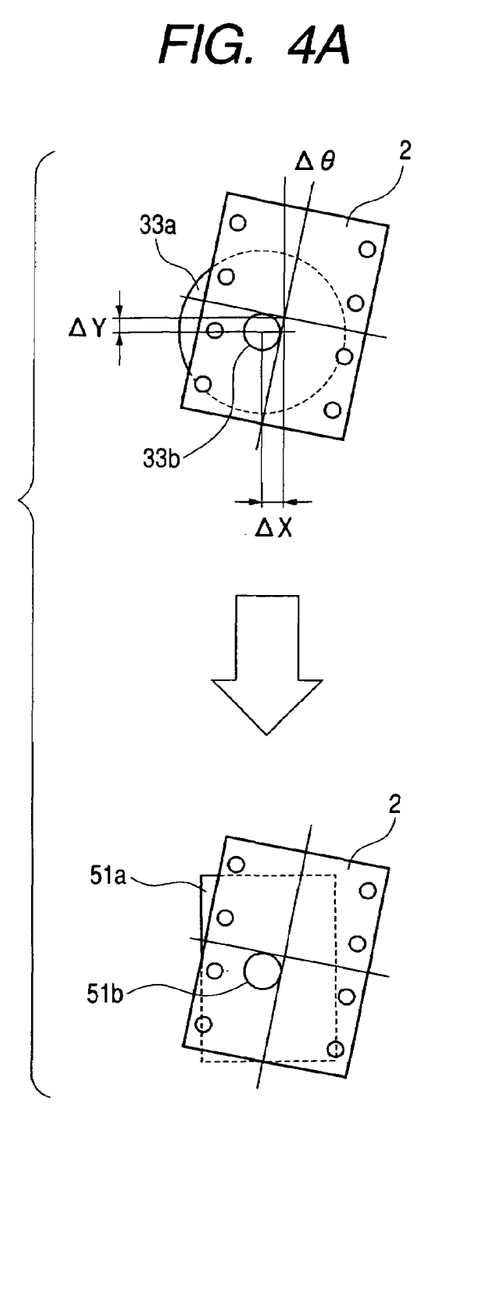
FIG. 4A is a view showing a positional relationship among a chip, a pick-up nozzle and a mounting nozzle in a conventional mounting apparatus.

Moreover, even when the chip holding portion is smaller in size than the chip and its shape is fitted for the chip shape, it is conceivable that the pick-up nozzle cannot properly receive a chip from the part loading position. For example, it is supposed that as shown in FIG. 4A, the pick-up nozzle holds a chip in a state in which a central position of the pick-up nozzle is displaced by $\Delta X$ and $\Delta Y$ in X-axis and Y-axis directions with respect to the center of the chip, and also a central axis of the pick-up nozzle is displaced by an angle $\Delta \theta$ with respect to a central axis of the chip. When paying attention to only a positional relationship between the chip and the circuit substrate as in the prior art, there is a big chance that these positional displacements are held even when the chip is delivered from the pick-up nozzle to a mounting nozzle (a suction nozzle for mounting).

If the chip is intended to be mounted in this state, when a space between the chip intended to be mounted and adjacent electronic parts is narrow, there is a possibility that an end portion of the mounting nozzle interferes with and come into contact with these electronic parts. Moreover, as a style adopted in the recent mounting, there is a case where a chip is mounted onto a circuit substrate so as to be fitted into a cavity defined within the circuit substrate. In this case, however, there is a possibility that an end portion of the nozzle is projected from an end portion of a chip to thereby disable the fitting work itself. In addition, when a chip is joined to a circuit substrate using an ultrasonic wave, there is also a possibility that a deviation or the like occurs in application of a weight to the chip, and this exerts a bad influence on the joining state. Such a positional displacement within the allowable level in a current chip size or a current mounting situation. However, such a positional displacement is desirably improved in terms of promotion of the increasing of narrower pitches or the like.

SUMMARY OF THE INVENTION

The present invention has been made in the light of the above situation, and it is, therefore, an object of the present invention to provide an apparatus and a method for mounting a chip in which a mounting nozzle is capable of holding a chip without causing any positional displacements.

In order to attain the above-mentioned object, according to the present invention, there is provided a method of mounting an electronic part which includes: picking up the electronic part placed on a table by a pick-up nozzle; delivering the electronic part from the pick-up nozzle holding the electronic part to a mounting nozzle; comparing a position of the electronic part held by the mounting nozzle and a position on a circuit substrate where the electronic part is mounted, to thereby correct the mounting position where the electronic part is mounted by the mounting nozzle; and mounting the electronic part onto the circuit substrate by the mounting nozzle, in which displacements of the electronic part held by the pick-up nozzle with respect to a reference position is detected, the displacements being obtained in the form of displacements in X- and Y-directions perpendicular to each other and an angle $\theta$ of rotation, and when delivering the electronic part to the mounting nozzle, the displacements in the X- and Y-directions and the angle $\theta$ of rotation are corrected to carry out a control such that the electronic part has a predetermined attitude with respect to the mounting nozzle.

According to the mounting method described above, it is preferable that any one of the displacements in the X- and Y-directions is corrected by a movement of the pick-up nozzle, and the other of the displacements in the X- and Y-directions and the displacement in the angle $\theta$ of rotation are corrected by an operation of the mounting nozzle.

Further, in order to attain the above-mentioned object, there is provided an apparatus for mounting an electronic part onto a circuit substrate, including: a table for placing and holding the electronic part, the table being movable in X- and Y-directions perpendicular to each other; a pick-up nozzle for picking up the electronic part placed on the table, the pick-up nozzle being movable in the X-direction; displacement amount detection means for capturing an image of the electronic part held by the pick-up nozzle to detect displacements of the electronic part with respect to a reference attitude, the displacements being obtained in the form of displacements in the X- and Y-directions perpendicular to each other and an angle θ; a mounting nozzle for mounting the electronic part onto the circuit substrate, to which the electronic part is delivered from the pick-up nozzle, and which is movable in the Y-direction and is capable of being rotated with an axis perpendicular to each of the X- and Y-directions as a center; and a substrate stage for holding the circuit substrate, in which when the electronic part is delivered from the pick-up nozzle to the mounting nozzle, the displacements in the X-direction, the Y-direction and the angle θ are corrected to carry out a control such that the electronic part has a predetermined attitude with respect to the mounting nozzle.

DESCRIPTION OF THE PREFERRED EMBODIMENTS

Figure 1:
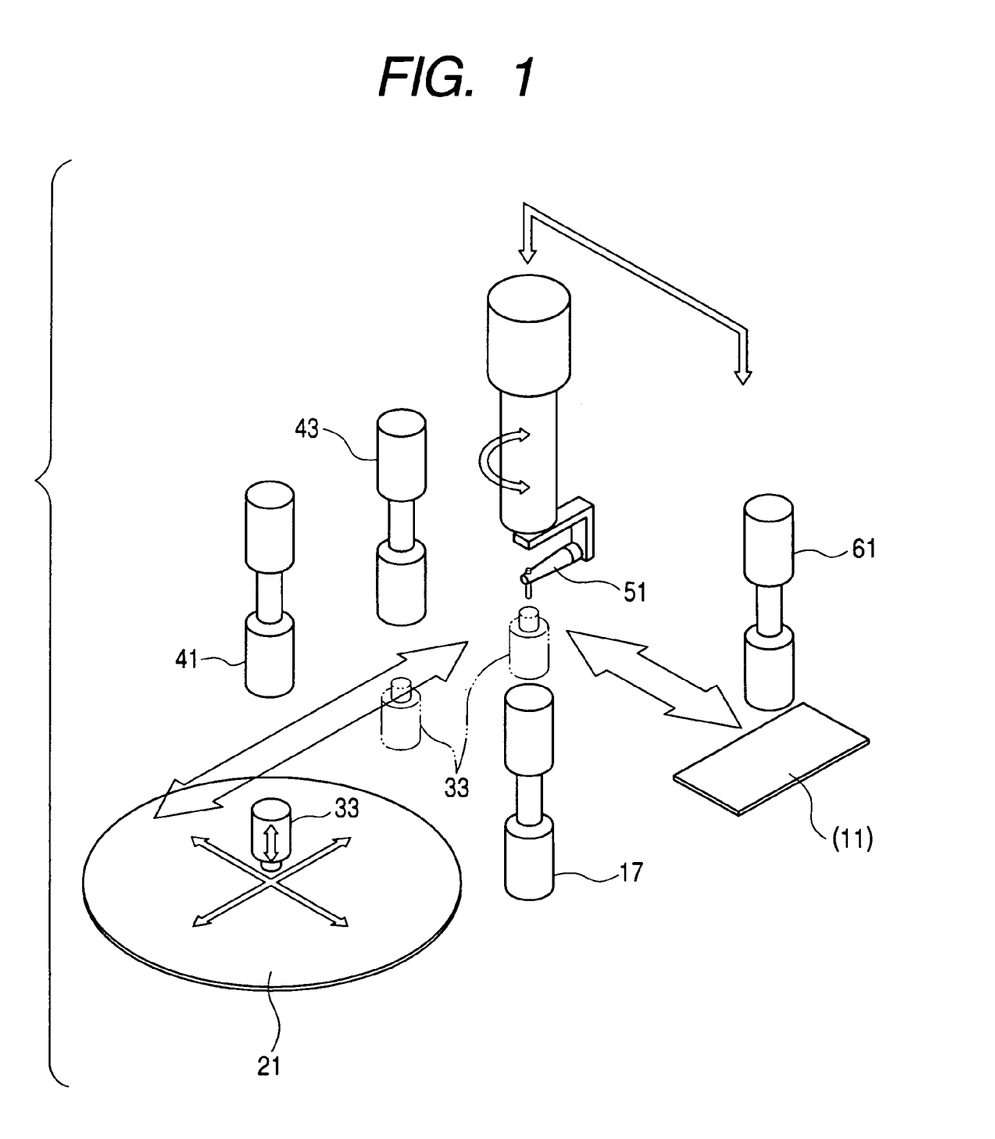
FIG. 1 is a view showing a construction of a main portion of a mounting apparatus according to the present invention in a simplified style.
Figure 2:
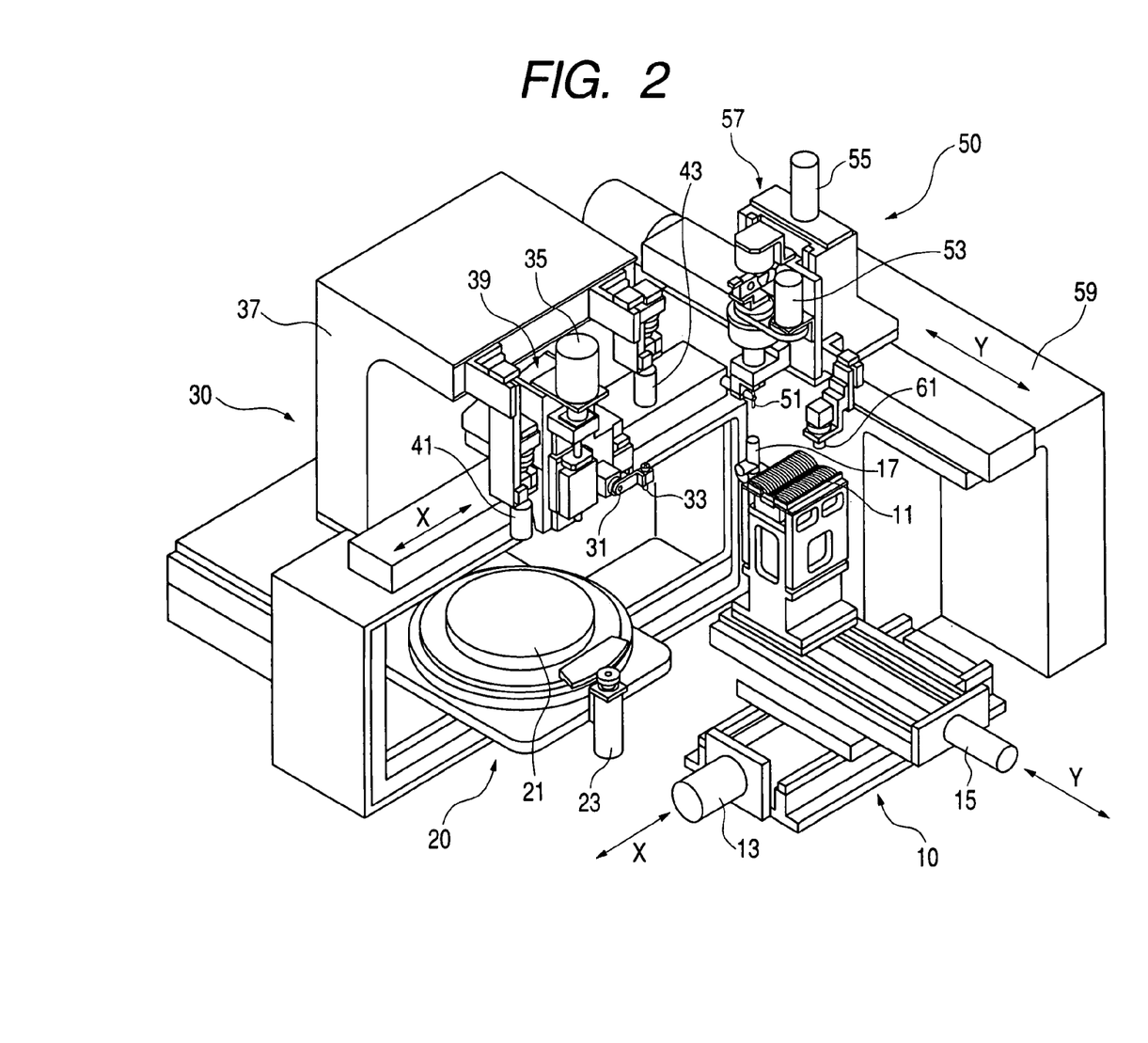
FIG. 2 is a view showing a schematic construction of the mounting apparatus according to the present invention.

An embodiment of the present invention will hereinafter be described in detail with reference to the accompanying drawings. FIG. 1 shows a schematic construction of a main portion in a mounting apparatus according to the present invention, and FIG. 2 shows a schematic construction of the mounting apparatus in a simplified style. As shown in FIG. 2, the mounting apparatus is constituted of a substrate table 10 for supporting a circuit substrate or the like, a part loading table 20 for supporting an electronic part, a part pick-up portion 30 for supporting a pick-up nozzle, and a mounting portion 50 for supporting a mounting nozzle.

The substrate table 10 includes a substrate stage 11 for actually supporting a substrate with vacuum suction or the like, an X-axis driving motor 13 for driving the substrate stage 11 in an X-axis direction indicated by an arrow in the figure, a Y-axis driving motor 15 for driving the substrate stage 11 in a Y-axis direction indicated by an arrow in the figure, and a part determination camera 17 for determining an attitude or the like of an electronic part held by a mounting nozzle which will be described later. The part determination camera 17 is fixed to the substrate stage 11 and always has a fixed positional relationship with the substrate stage 11.

The part loading table 20 includes a table 21 on which a part is to be placed, a driving motor (not shown) for driving the table 21 in the X-axis and Y-axis directions, and a rotation driving motor 23 for driving and rotating the table 21 on an X-Y plane. A part placing substrate which has a shape nearly equal to that of a wafer and which is paved with electronic parts such as flip chips, for example, is fixed onto the table 21 with vacuum suction or the like. These electronic parts are merely placed on the part placing substrate, and hence can be readily picked up from the part placing substrate.

The part pick-up portion 30 includes a pick-up nozzle 33 which is rotatably supported by an axis 31 of rotation for reversing a chip in upward and downward direction, and a pick-up nozzle ascending/descending motor 35 for driving the axis 31 of rotation and the pick-up nozzle 33 so that the axis 31 of rotation and the pick-up nozzle 33 are ascended and descended. These constituent elements are integrated with each other in the form of a pick-up portion unit 39, and are supported by a pick-up portion base stage 37 so as to be driven in the X-axis direction by a driving motor (not shown). In addition, the part pick-up portion 30 further includes a determination camera 41 for determining a loaded part and a pre-alignment camera 43. These constituent elements are fixed to and supported by the base stage 37, independently of the unit 39 which has the pick-up nozzle 33 and the like.

The pre-alignment camera 43 captures an image of a chip held by the part pick-up nozzle 33. A picture obtained through the image-capturing is image-processed to obtain the amounts of displacements with respect to a reference position or a reference attitude when holding a chip. The amount of displacements are obtained in the form of the amount of displacement in the X-axis direction, the amount of displacement in the Y-axis direction, and an angle θ. These amounts of displacements are calculated by a controller (not shown) which constitute a unit for detecting the amounts of displacements together with the pre-alignment camera 43.

The mounting portion 50 includes a mounting nozzle 51 having a function of being able to mount an electronic part onto a circuit substrate using an ultrasonic wave, for example, a θ rotation motor 53 for driving and rotating the mounting nozzle 51 with an axis perpendicular to the X-Y plane as a center, and a mounting nozzle ascending/descending motor 55 for ascending/descending the nozzle 51 and the motor 53. These constituent elements are integrated with each other in the form of a mounting unit 57 and are supported by a mounting portion base stage 59 so as to be able to be driven in the Y-axis direction by a driving motor (not shown). Note that a substrate mark determination camera 61 is fixed to and supported by the mounting unit 57, independently of the mounting nozzle 51, the θ rotation motor 53, and the mounting nozzle ascending/descending motor 55.

Note that the driving for the constituent elements in the X-axis direction and the Y-axis direction is made with combinations of ball screw axes, guide reels, and the like directly connected to the driving motors, respectively. Thus, a description of these constituent elements is omitted here for the sake of simplicity. In addition, these constructions are well known, and it is desirable to suitably replace these constituent elements with any of other known constituent elements in accordance with the required stop accuracy and driving speed. Also, in this embodiment, the part pick-up nozzle is adapted to be moved in the X-axis direction, and the mounting nozzle is adapted to be moved in the Y-axis direction. However, a construction may also be adopted such that the part pick-up nozzle is adapted to be moved in the Y-axis direction, and the mounting nozzle is adapted to be moved in the X-axis direction.

Figure 3:
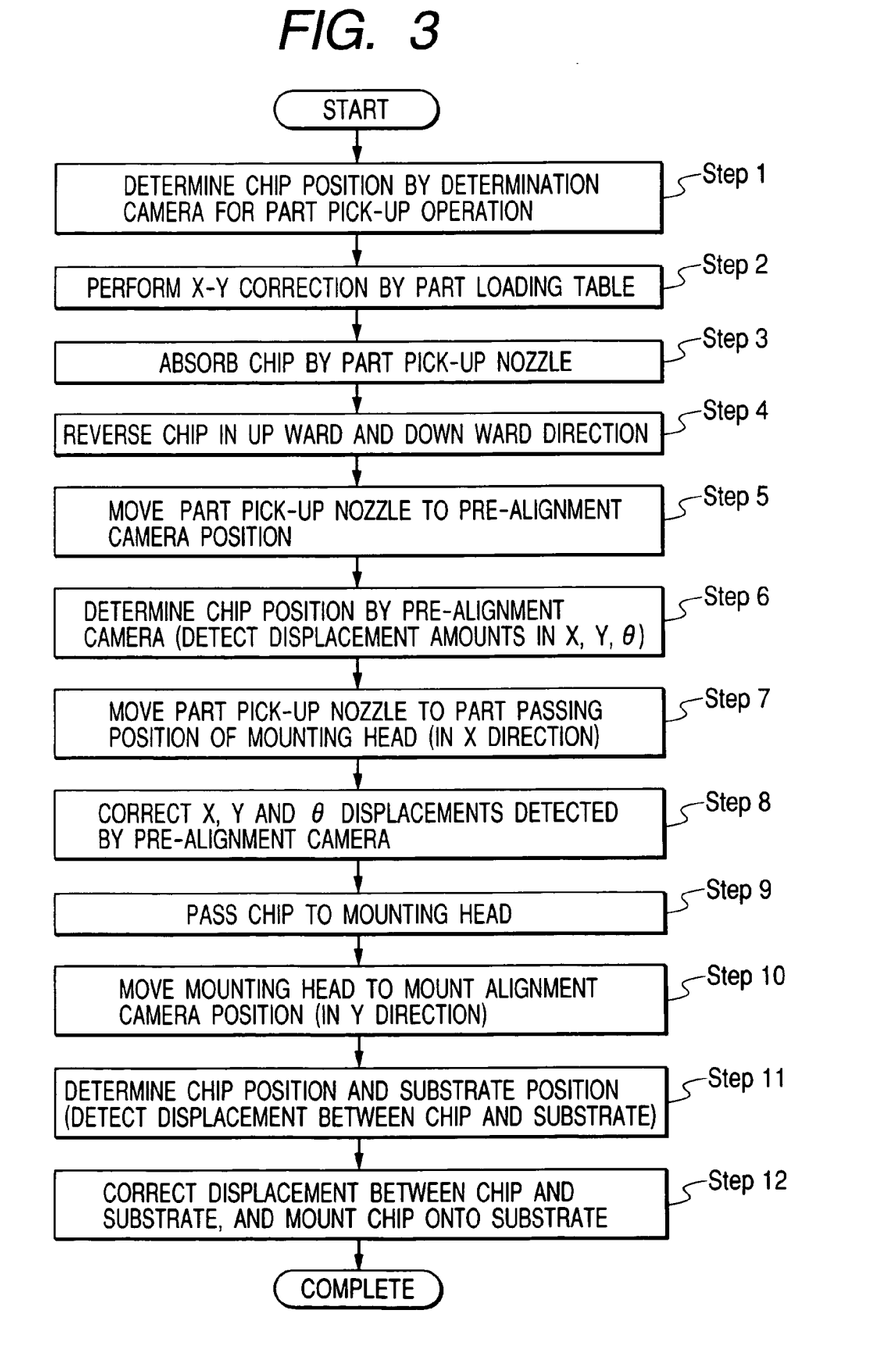
FIG. 3 is a flow chart useful in explaining a mounting method according to the present invention.

Next, a process for mounting an electronic part will hereinbelow be described in detail with reference to FIG. 1 and FIG. 3 showing a flow chart useful in explaining a procedure for actually mounting an electronic part. Upon start of the process for mounting an electronic part, first of all, in Step 1, a position of an electronic part such as a chip to be mounted which is placed on the substrate stage 11 is determined by the determination camera 41 for determining a loaded part. Next, in Step 2, the substrate stage 11 is driven in the X-axis and Y-axis directions to carry out correction so that a position where the chip to be mounted is arranged on the X-Y plane agrees with a position where the chip to be mounted is intended to be picked up by the part pick-up nozzle 33. Thereafter, in Step 3, the part pick-up nozzle 33 is descended to suck and hold the chip to be mounted.

In Step 4, the part pick-up nozzle 33 holding the chip to be mounted is rotated round the axis 31 of rotation to reverse the chip in upward and downward direction to thereby directing the chip upwardly. Moreover, in Step 5, the part pick-up nozzle 33 is driven and moved in the X-axis direction to a position below the pre-alignment camera 43. Then, an image of the chip is captured in this position. In Step 6, the amounts of displacements in X, Y and θ with respect to a predetermined reference attitude of the chip concerned are obtained on the basis of the image capturing results. After detection of the amounts of displacements, in Step 7, the part pick-up nozzle 33 which holds the chip in the state of reversing the chip upward and downward direction is moved to a position below the mounting nozzle 51 standing by in a chip delivery position.

Next, in Step 9, the mounting nozzle 51 is descended to come into contact with the chip and then sucks the chip with vacuum suction or the like. Thereafter, the chip is released from a state in which the chip is vacuum-sucked by the part pick-up nozzle 33, and so forth, to complete the delivery of the chip from the part pick-up nozzle 33 to the mounting nozzle 51. Note that, before the mounting nozzle 51 comes into contact with the chip, in Step 8, the arrangement (attitude) of the mounting nozzle with respect to the chip is previously corrected in accordance with the amounts of displacements obtained in Step 5. More specifically, the amount $\Delta X$ of displacement in the X-axis direction is corrected on the basis of the driving of the part pick-up nozzle 33 in the X-axis direction. Also, the amount $\Delta Y$ of displacement in the Y-axis direction, and the amount $\Delta \theta$ of displacement of the chip rotation are corrected on the basis of the driving of the mounting nozzle 51 in the Y-axis direction and the driving of the mounting nozzle 51 in the θ direction, respectively. As a result, the mounting nozzle 51 can always hold the chip in a predetermined attitude.

Figure 4B:
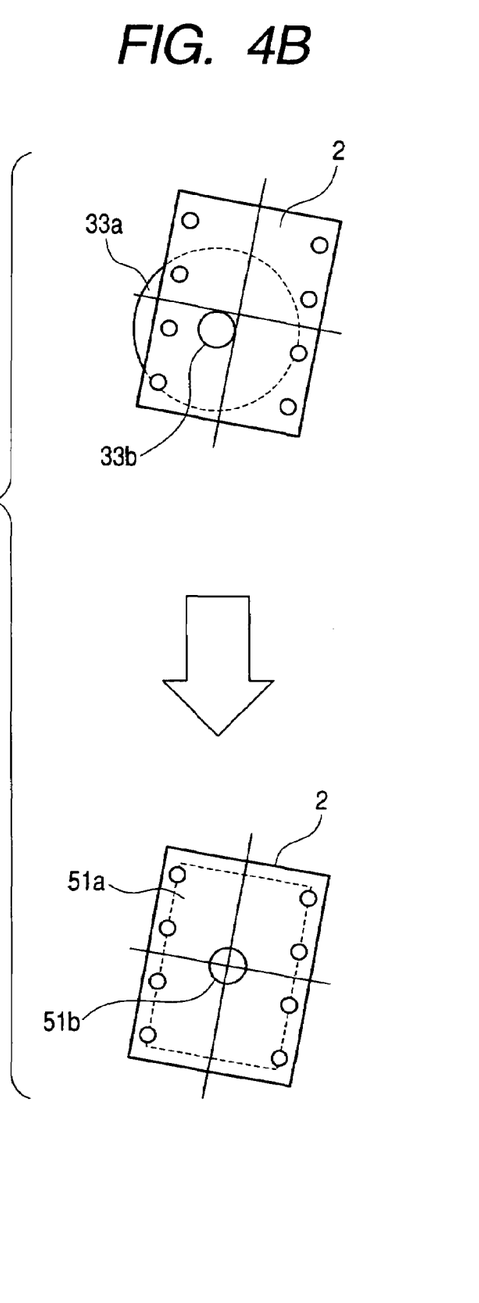
FIG. 4B is a view showing a positional relationship among a chip, a pick-up nozzle and a mounting nozzle in the mounting apparatus according to the present invention.
Figure 5:
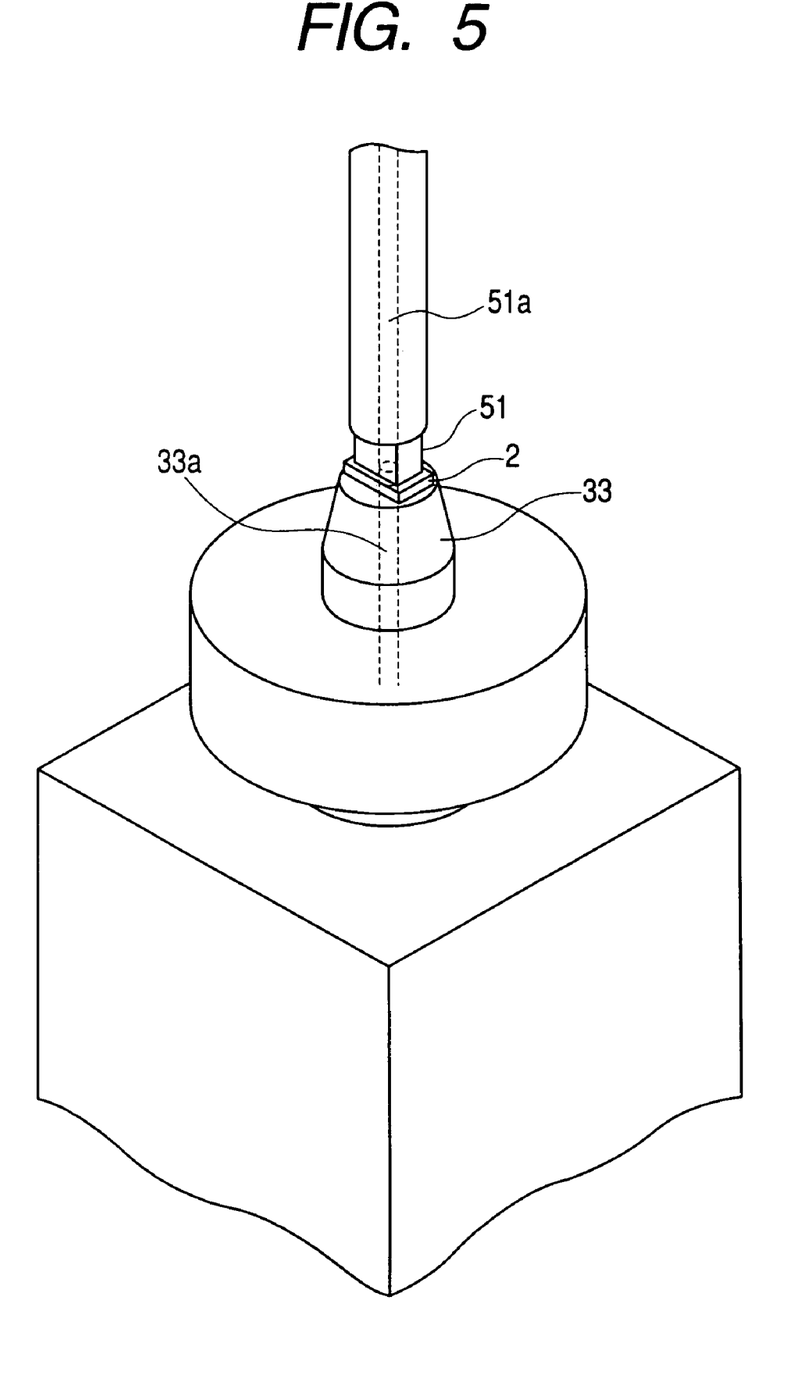
FIG. 5 is a perspective view showing a state of delivery of a chip between a pick-up nozzle and a mounting nozzle after completion of corrections for X, Y and θ displacements in the present invention.

FIG. 5 is an enlarged perspective view showing the outline of a concrete example of a positional relationship among the mounting nozzle 51, the chip 2, and the part pick-up nozzle 33. In the figure, the chip 2 has substantially a rectangular parallelepiped-like shape, and an upper surface of the chip 2 is sucked and held by a port 51a for vacuum suction. In addition, a lower surface of the chip 2 has bumps intended to be joined to a circuit substrate, and also is sucked and held by a port 33a for vacuum suction provided so as to completely extend through the part pick-up nozzle 33. As will be described later with reference to FIGS. 4A and 4B, a chip suction face of the mounting nozzle 51 has a shape which is nearly equal to or slightly smaller than that of the upper surface of the chip 2. The implementation of the present invention makes it possible that the chip suction face of the mounting nozzle 51 has the shape as shown in the figure.

After completion of the delivery of the chip to the mounting nozzle 51, in Step 10, the mounting nozzle 51 is driven in the Y-axis direction towards the circuit substrate. Note that in Step 11, an attitude of the chip is determined by the part determination camera 17 during the driving. Note that during the processing so far, the capturing of the image of the circuit substrate, and the detection of the chip mounting position based on the image capturing results are made by the substrate mark determination camera 61. In Step 11, an attitude of holding the chip is determined, and also a positional relationship between a chip mounting position and a chip holding attitude is obtained to acquire positional displacements of the chip holding state with respect to the substrate mounting position again.

In subsequent Step 12, the substrate stage 11 is driven in the X-axis and Y-axis directions to correct the amounts of displacements of the circuit substrate in the X-axis and Y-axis directions obtained in Step 11. Note that the correction for the amount of displacement in the θ direction may be made again although there is a big chance that the amount of displacement have fallen within the allowable range in Step 8. However, if necessary, this correction may be made again. Thereafter, in Step 13, the mounting head 51 is descended to the circuit substrate, and a process for press-joining and mounting the chip onto the circuit substrate is carried out to complete one mounting process.

In brief, the above flow is roughly classified into two processes, the first process and the second process, which will be described below. The first process is a process in which the chip arranged in a position determined by the determination camera for determining a loaded part is picked up by the part pick-up nozzle, an attitude of the chip held by the part pick-up nozzle is detected by the pre-alignment camera, and the mounting nozzle holds the chip in a predetermined attitude in accordance with the detection results. Effects offered through this process will hereinbelow be described with reference to FIGS. 4A and 4B. FIG. 4A shows the conventional case where no pre-alignment was made, and FIG. 4B shows a state in which the pre-alignment in the present invention was made. Both figures show a state in which the chip 2 is held at the head portion 33a of the part pick-up nozzle 33, which is viewed from a chip 2 side, and a state in which the chip 2 is held at the head portion 55a of the part pick-up nozzle 55, which is viewed from a chip 2 side. In addition, In these figures, the nozzle head portions 33a and 51a have the ports 33b and 51b for suction used in the vacuum suction, respectively. It is desirable that the mounting nozzle has a shape which is nearly equal to and slightly smaller than that of the sucked surface of the chip because the mounting nozzle press-joins the chip 2 to the circuit substrate (not shown). However, according to the conventional process, there is a possibility that a situation, as shown in FIG. 4A, may occur in which a side portion of the mounting nozzle 51 is projected from a side portion of the chip 2. By carrying out the first process in which the pre-alignment is made, as shown in FIG. 4B, the chip is held by the mounting nozzle in a state in which all the X-axis, the Y-axis and the angle θ of rotation of the mounting nozzle agree with those of the chip. Thus, in a case where the chips are arranged on the circuit substrate at much narrower pitches than those of the prior art, or even in a case where the chips are mounted within the cavities, the mounting nozzle does not interfere with any of other chips, and also it becomes possible to provide a state in which the chips are stably joined to the substrate.

The second process is a process in which the position and the attitude of the chip held by the mounting nozzle are determined again, the positional relationship between the position and the attitude of the chip held by the mounting nozzle and the position on the circuit substrate where the chip is intended to be mounted are obtained, and the chip is joined to the circuit substrate after taking these positional relationships into consideration. The chip 2 which is properly held by the mounting nozzle 51 is subjected to the correction processing with respect to the joining position again to allow the chip to be more accurately mounted onto the circuit substrate.

Note that in the conventional mounting apparatus, a construction is also adopted such that this delivery process is once carried out through an intermediate stage when a chip is delivered from a part pick-up nozzle to a mounting nozzle for the purpose of shortening a mounting tact time. In the present invention as well, such a construction is adopted that an intermediate stage of the like is provided, and an attitude or the like of a chip is detected on the intermediate stage, whereby the effects for mounting are obtained.

However, in order to attain this, it is necessary to give the intermediate stage a function for driving in X-axis and Y-axis directions, and hence an apparatus construction becomes complicated. In addition, there is also a possibility that interposition of the intermediate stage increases the number of times of delivery of the chip. Along with this increase, an attitude or the like of the chip further increases the amounts of displacements as compared with those when the chip is picked up. If an increase in the amount of correction or in the number of correction parameters, and also a movement of the intermediate stage in the X-axis and Y-axis directions are taken into consideration, when the positional relationship between the mounting nozzle and the chip is intended to be always maintained fixed, it is also conceivable that the effect of shortening the tact time can not be obtained so much.

In the light of the foregoing, in the present invention, the mounting apparatus with a simpler construction is constructed without providing the intermediate stage. Consequently, the position correction when the mounting nozzle holds the chip, and the position correction when the chip is mounted onto the circuit substrate with the mounting nozzle are carried out with the correction of the number of axes having the minimum number of times. For this reason, the mounting apparatus has high reliability, and the adjustment or the like at the first stage of the operation is readily carried out. Thus, it becomes possible to provide the mounting apparatus having high convenience.

Moreover, according to the present invention, there is no large difference between the conventional mounting process and the mounting process of the present invention except that a process for detecting $\Delta\theta$ with the pre-alignment camera, and a process for correcting $\Delta\theta$ when the chip is delivered to the mounting nozzle are additionally included. Consequently, by only adding detection process and the correction process to the conventionally used mounting apparatus, the same effects are obtained for the mounting apparatuses having the various carrier systems as well. That is to say, even in a case where the conventional mounting apparatus is diverted in order to implement the present invention, it becomes possible to carry out the narrower pitch mounting, the cavity mounting, or the like without requiring a high cost.

In addition, while for this embodiment, there is supposed a case or the like where relatively miniature chips are mounted with high density, the present invention is not intended to be limited to this embodiment. More specifically, for example, when a relatively large electronic part is mounted, the electronic part concerned can be surely held in a desired state by a mounting nozzle which has an end face having a shape nearly equal and slightly smaller than that of the electronic part concerned. Consequently, it becomes possible to apply a uniform weight to the whole end face of the electronic part in order to mount the electronic part, and hence it becomes possible to obtain a state of excellent joining between the chip and the circuit substrate.

The implementation of the present invention makes it possible that even if there is used the mounting nozzle which has the suction end portion having a shape nearly equal to and slightly smaller than that of the chip, when the mounting nozzle holds the chip, the end portion of the mounting nozzle is not projected from the side portion of the chip, and the chip can be always held in a fixed attitude. Consequently, even when the high density mounting, the narrower pitch mounting or the cavity mounting is carried out, it becomes possible to carry out the mounting with high accuracy without the mounting nozzle interfering with any of other chips, the circuit substrate, and the like.

In addition, the implementation of the present invention makes it possible that when a weight is applied to the chip by the mounting nozzle to mount the chip onto the circuit substrate, the center of the suction end portion of the mounting nozzle always agrees with the center of the chip. Consequently, the weight applied from the mounting nozzle to the chip always becomes uniform for the whole joining surface, and hence the joining state having high reliability and excellent accuracy is stably obtained.

Also, the implementation of the present invention becomes possible by adding the process for detecting $\Delta\theta$ with the pre-alignment camera and the process for correcting $\Delta\theta$ when delivering the chip to the mounting nozzle. Consequently, the mounting apparatus having the conventionally used simple carrier system can be diverted as it is, and hence the present invention can be implemented at low cost.

What is claimed is:

1. A method of mounting an electronic part, comprising:
   picking up the electronic part placed on a table by a pick-up nozzle;
   delivering the electronic part from the pick-up nozzle holding the electronic part to a mounting nozzle;
   comparing a position of the electronic part held by the mounting nozzle and a position on a circuit substrate where the electronic part is mounted, to thereby correct the mounting position where the electronic part is mounted by the mounting nozzle, including detecting displacements of the electronic part held by the pick-up nozzle with respect to a reference position, the displacements being obtained in the form of displacements in X- and Y-directions perpendicular to each other and an angle $\theta$ of rotation;
   mounting the electronic part onto the circuit substrate by the mounting nozzle, and
   when delivering the electronic part to the mounting nozzle, correcting the displacements in the X- and Y-directions and the angle $\theta$ of rotation to carry out a control such that the electronic part has a predetermined attitude with respect to the mounting nozzle.

2. A mounting method according to claim 1, wherein any one of the displacements in the X- and Y-directions is corrected by a movement of the pick-up nozzle, and the other displacement in the X- and Y-directions and the other of the displacements in the angle θ of rotation are corrected by an operation of the mounting nozzle.

* * * * *